United States Patent
Dixon

(10) Patent No.: US 9,276,030 B2
(45) Date of Patent: Mar. 1, 2016

(54) READ OUT INTEGRATED CIRCUIT INPUT/OUTPUT ROUTING ON PERMANENT CARRIER

(71) Applicant: SENSORS UNLIMITED, INC., Princeton, NJ (US)

(72) Inventor: Peter E. Dixon, Princeton, NJ (US)

(73) Assignee: SENSORS UNLIMITED, INC., Princeton, NJ (US)

( * ) Notice: Subject to any disclaimer, the term of this patent is extended or adjusted under 35 U.S.C. 154(b) by 279 days.

(21) Appl. No.: 13/838,265

(22) Filed: Mar. 15, 2013

(65) Prior Publication Data

US 2014/0263955 A1    Sep. 18, 2014

(51) Int. Cl.
H01L 27/146    (2006.01)

(52) U.S. Cl.
CPC .... *H01L 27/14636* (2013.01); *H01L 27/14618* (2013.01); *H01L 27/14634* (2013.01); *H01L 2924/0002* (2013.01)

(58) Field of Classification Search
CPC combination set(s) only.
See application file for complete search history.

(56) References Cited

U.S. PATENT DOCUMENTS

| 7,348,671 | B2 | 3/2008 | Kirby |
| 7,671,435 | B2 * | 3/2010 | Ahn ............................... 257/444 |
| 8,232,137 | B2 | 7/2012 | Gaul et al. |
| 2005/0130345 | A1 * | 6/2005 | Jeung et al. .................... 438/106 |
| 2012/0194719 | A1 * | 8/2012 | Churchwell et al. .......... 348/302 |

* cited by examiner

*Primary Examiner* — Francis M Legasse, Jr.
(74) *Attorney, Agent, or Firm* — Cantor Colburn LLP

(57) ABSTRACT

A focal plane array (FPA) comprising a photodiode array (PDA) and a read out integrated circuit (ROIC), wherein the FPA can include a plurality of conductive bumps that electrically couple PDA circuitry to ROIC circuitry. In an embodiment, an optically transparent lid can include a plurality traces electrically coupled to circuitry on the ROIC which can be used as a conductive path between the ROIC and external pads.

15 Claims, 2 Drawing Sheets

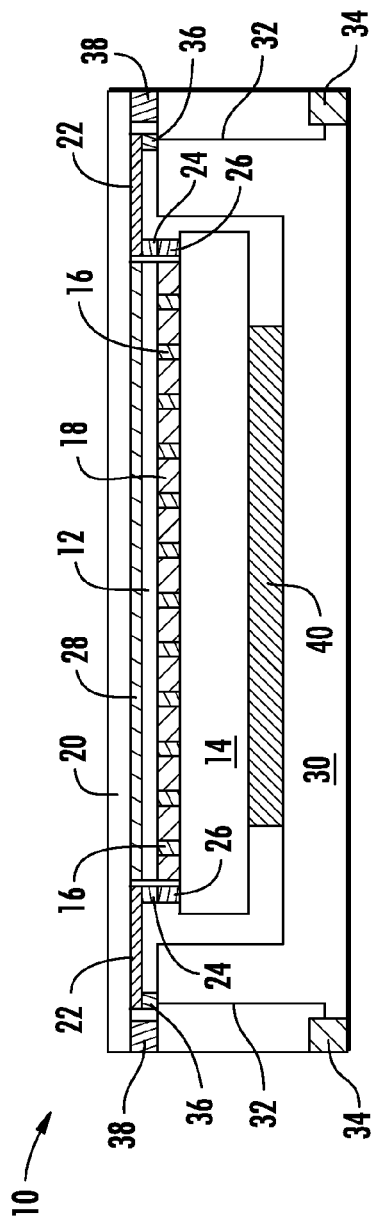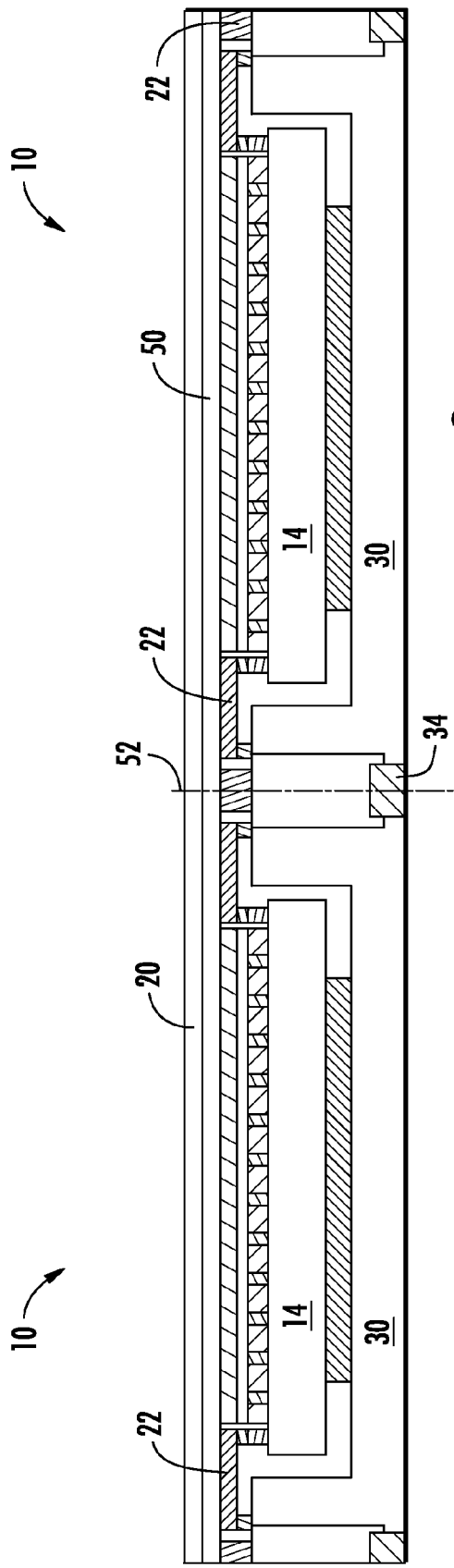

READ OUT INTEGRATED CIRCUIT INPUT/OUTPUT ROUTING ON PERMANENT CARRIER

FIELD OF THE EMBODIMENTS

The present teachings relate to the field of integrated circuits and, more particularly, to packaging for a focal plane array device including a photodiode array and a read out integrated circuit.

BACKGROUND OF THE EMBODIMENTS

Light-sensitive image sensors such as focal plane array (FPA) devices include a photodiode array (PDA) packaged with a read out integrated circuit (ROIC). Many different FPA package configurations are available including, for example, leaded and leadless packages. Each conventional package type for FPA can include various shared characteristics.

FIG. 3 depicts a schematic cross-section of an FPA device 200 packaged as a leadless chip carrier (LCC). FIG. 3 includes a ceramic, plastic, or resin carrier body 202 including internal traces 204 electrically coupled to external pads or castellations 206. The external pads 206 can be surface mounted to a circuit board using a conductor, or the device 200 can be placed into an LCC socket. FIG. 3 further depicts a ROIC 208 physically attached to the carrier 202 using an adhesive 210. Bond wires 212 electrically couple bond pads (not individually depicted for simplicity) on the ROIC 208 to the traces 204 within the carrier body 202 such that circuitry on the ROIC 208 can be electrically accessed through the external pads 206. A PDA 214 is mounted to the upper surface of the ROIC 208 using a nonconductive adhesive (not individually depicted for simplicity). Other bond wires 218 electrically couple circuitry on the PDA 214 to circuitry on the ROIC 208. A package lid 216 hermetically sealed to the carrier 202 includes a clear window 216A that exposes the PDA 214 to external light. In the device 200 of FIG. 3, the carrier 202 is configured such that the lower surface of the lid 216 does not contact the loop in the bond wires 212, 218. FPAs including ROICs and PDAs provided in different package styles are well known.

Design goals for semiconductor device engineers include providing devices having smaller dimensions, a reduced cost, and improved reliability. A device design that helped to accomplished one or more these goals would be desirable.

SUMMARY OF THE EMBODIMENTS

The following presents a simplified summary in order to provide a basic understanding of some aspects of one or more embodiments of the present teachings. This summary is not an extensive overview, nor is it intended to identify key or critical elements of the present teachings nor to delineate the scope of the disclosure. Rather, its primary purpose is merely to present one or more concepts in simplified form as a prelude to the detailed description presented later.

In an embodiment of the present teachings, a focal plane array (FPA) can include a read out integrated circuit (ROIC) comprising a circuit side having circuitry thereon, a photodiode array (PDA) comprising circuitry including a plurality of photodiodes, and a conductor interposed between the PDA and the ROIC, wherein the conductor electrically couples circuitry on the PDA to circuitry on the ROIC.

In another embodiment, a method for forming a focal plane array (FPA) can include physically contacting a first plurality of landing pads on a photodiode array (PDA) to a conductor, physically contacting a second plurality of landing pads on a read out integrated circuit (ROIC) to the conductor, wherein the conductor is interposed between the PDA and the ROIC, curing the conductor to physically attach the PDA and the ROIC to each other and to electrically couple circuitry on the PDA with circuitry on the ROIC, and attaching the PDA to an optically transparent lid.

BRIEF DESCRIPTION OF THE DRAWINGS

The accompanying drawings, which are incorporated in and constitute a part of this specification, illustrate embodiments of the present teachings and together with the description, serve to explain the principles of the disclosure. In the figures:

FIG. 1 depicts a cross section of a focal plane array according to an embodiment of the present teachings;

FIG. 2 depicts a cross section of a plurality of focal plane arrays formed as part of a wafer scale integration process.

Figure 3:
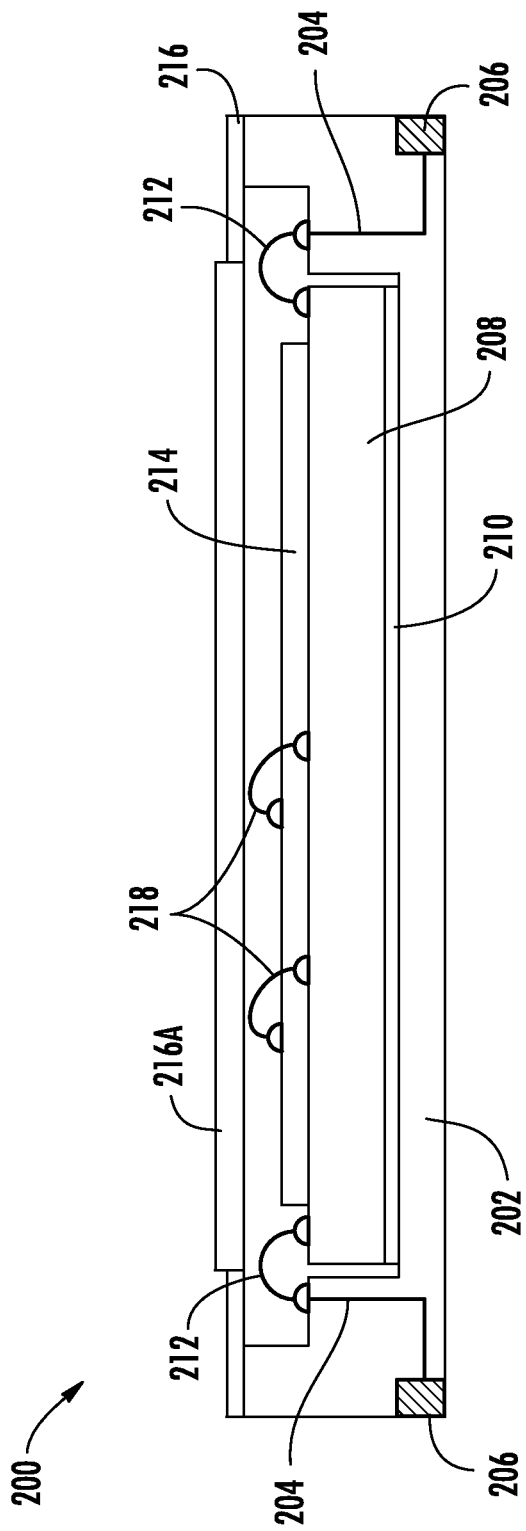
FIG. 3 depicts a conventional focal plane array.

It should be noted that some details of the FIGS. have been simplified and are drawn to facilitate understanding of the present teachings rather than to maintain strict structural accuracy, detail, and scale.

DESCRIPTION OF THE EMBODIMENTS

Reference will now be made in detail to exemplary embodiments of the present teachings, examples of which are illustrated in the accompanying drawings. Wherever possible, the same reference numbers will be used throughout the drawings to refer to the same or like parts.

While embodiments of the present teachings are described with reference to a device packaged as a leadless chip carrier (LCC), it will be understood that a device in accordance with the present teachings can be packaged as a leaded device or as other leadless devices.

Achieving reliable electrical connections within a conventional device package becomes more challenging at decreasing device dimensions. Bond wires 212, 218 such as those depicted in FIG. 3 are relatively large and require correspondingly large bond pads as a bonding surface. For example, conventional read out integrated circuit (ROIC) bond pads for focal plane array (FPA) devices can be about 100 μm by about 160 μm. Additionally, the lower surface of the lid 216 must be above the top of the loop in the bond wire 212 as depicted in FIG. 3, which increases the overall package height.

An embodiment of the present teachings can result in a more robust electrical connection between circuitry on the ROIC and connections at the exterior of the package, and between circuitry on the ROIC and circuitry on the PDA, compared to bond wires of conventional packages. Additionally, in an embodiment, bond wires may be eliminated which allows the height of the package to be decreased, for example because the lower surface of the lid can be closer to the PDA than is possible with conventional devices.

FIG. 1 is a schematic cross section depicting an FPA device 10 in accordance with an embodiment of the present teachings, and includes a first semiconductor chip that can be a PDA 12 and a second semiconductor chip that can be a ROIC 14. It will be understood that the PDA 12 and the ROIC 14 can be formed using conventional technology except where indicated. In the embodiment of FIG. 1, the FPA device 10 may not include any wire bonds, particularly wire bonds that provide power and ground for the ROIC, and/or input/output (I/O) signals to and from the ROIC 14, and/or electrical connections between the PDA 12 and the ROIC 14.

In the device of FIG. 1, a plurality of conductive bumps 16, for example indium bumps or posts 16 similar to ball grid array (BGA) bumps, can be formed between circuitry such as pixels on the PDA 12 and circuitry on the ROIC 14. The bumps 16 can be formed according to known techniques. In an embodiment, a plurality of first landing pads (not individually depicted in FIG. 1) on the PDA 12 are electrically coupled to a second plurality of landing pads (not individually depicted in FIG. 1) on the ROIC 14 using the bumps 16. In an embodiment, a dielectric fill 18 can be provided around the plurality of bumps 16. The bumps 16 can provide the functionality of the bond pads 218 (FIG. 3) of conventional devices.

Prior to device assembly, a lid (i.e., window) 20 is prepared. The lid can be a material that is optically transparent (which, for purposes of this disclosure, includes optically translucent) to the light wavelength to be detected by the completed FPA 10. In various embodiments, the lid 20 may be glass, a polymer, or a semiconductor material such as silicon, depending on the light wavelength to be detected. To prepare the lid 20, a plurality of conductive patterned traces 22 are formed on the lower surface of the lid 20, where the lower surface is within an interior of the completed FPA 10.

In an embodiment, a blanket conductive layer can be formed on the lower surface of the lid, for example using CVD or a sputtering process, which is then patterned and etched using known lithographic techniques. Using this process, the traces 22 will extend from the lower surface of the lid 20 by a distance equal to the thickness of the traces 22. In an embodiment, the traces 22 can have a width of between about 2 µm and about 25 µm, as needed for proper conductivity or current-resistance requirements. The traces may also have a pitch of between about 10 µm and about 200 µm, offering greater range of capability to manage high interconnect density, thus enabling design freedom previously restricted by bond pad layout. Further, the traces can have a thickness of between about between 1 µm and about 5 µm, depending upon electrical or mechanical requirements. Forming traces 22 at these dimensions assist in aligning the traces 22 with landing pads 26 (discussed below) on the ROIC 14 and provide acceptable electrical resistance of the traces 22.

In another embodiment for forming the traces 22, a plurality of trenches can be chemically or mechanically etched using a lithographic process or laser etched into the lower surface of the lid. A blanket conductive layer can be formed over the lower surface within the trenches, and then a polishing process can be used to remove the blanket conductive layer from the lower surface of the lid 20 except for within the trenches (a process typically referred to as a damascene process). Using this process, the exposed surface of the traces will be co-planar or almost co-planar with the lower surface of the lid, or may be recessed within the trenches.

A conductor 24, such as an indium bump, can be used to electrically couple each trace 22 to a third plurality of landing pads 26 that connect with circuitry (not individually depicted for simplicity) on the surface of the ROIC 14. In an embodiment, a lower surface of the lid 20 can be physically attached to the PDA 12 using a dielectric 28 such as glass, polymer, a thermoset, or a thermoplastic, which may provide additional support for the various electrical interconnections.

FIG. 1 further depicts a package body 30. The package body 30 of FIG. 1 is a leadless chip carrier (LCC) package body, but it will be understood that package body 30 can also represent various other embodiments of the present teachings, such as other leaded or leadless form factors, or a printed circuit board (PCB) or other substrate. Manufactured within the package body 30 are a second plurality of traces 32 that are electrically coupled to a plurality of pads or castellations 34 that are external to the package body 30. A conductor 36 electrically couples the plurality of first traces 22 on the lid 20 to the second plurality of traces 32 within the package body 30. Physical connection of the lid 20 to the package body 30 can include the use of a hermetic sealing material 38 such as a metal, epoxy, polymer, eutectic, etc. In an embodiment, the lower surface of the ROIC 14 can be attached to a surface of the package body 30 as depicted using a conductive or dielectric attachment material 40, which secures the ROIC 14 in the package body 30 and may give support for other connections such as connections 16, 24, and 36. In another embodiment, structure 40 may schematically represent a thermoelectric cooler (TEC).

In a method for forming the FIG. 1 structure, various subassemblies including the PDA 12, the ROIC 14, the lid 20, and the package body 30 are prepared, and then assembly of the device subassemblies can begin. Various different process flows for forming the FPA device 10 of FIG. 1 are contemplated. In an embodiment, a plurality of FPA devices 10 can be manufactured simultaneously in a wafer scale integration process and, after completion of the plurality of physically connected wafer scale devices 10, the plurality of physically connected wafer scale devices 10 are singularized to form a plurality of individual devices 10. The process flow described below describes the formation of a single device which can be formed individually or as one of a plurality of wafer scale devices.

In one process flow, a PDA 12 can be fabricated as an epitaxial layer on a sacrificial carrier substrate 50 (FIG. 2, not individually depicted in FIG. 1 for simplicity), and a ROIC 14 can be separately fabricated. The plurality of conductive bumps 16 can be formed on a plurality landing pads on an exposed surface of the PDA 12 or on a plurality of landing pads on the ROIC 14. The plurality of ROIC 14 landing pads and PDA 12 landing pads, and the associated circuitry, have not been individually depicted for simplicity. The PDA 12 and ROIC 14 are aligned to each other such that the landing pads of each device contact the plurality of bumps 16 such that the bumps 16 are interposed between the PDA 12 and the ROIC 14, then the bumps 16 are reflowed to physically attach and electrically couple the ROIC 14 to the PDA 12. It will be appreciated that other conductors and processes may be used to interconnect the PDA 12 and the ROIC 14, such as a process using a conductive epoxy, a z-axis conductor, etc. After attachment, a dielectric underflow material 18 can be interposed between the ROIC 14 and the PDA 12, and around the bumps 18.

Subsequently, the substrate 50 can be thinned, for example using a semiconductor back-grinding process or other chemical, mechanical, or chemo-mechanical techniques. The PDA 12 connected to the ROIC 14 can be physically attached to the lid 20 with an adhesive or other such bond 28 that is optically transparent to the light wavelength of interest. In an embodiment, the bond 28 may include a waferbonding solution employed in 3-D integrated circuit (3DIC) constructions, such as a glass frit, a polymer, a thermoplastic, or a thermoset.

Next, the lid 20, including the attached PDA 12 and ROIC 14, can be physically attached and electrically coupled to the package body 30. A first end of each trace 22 can be physically attached and electrically coupled to a landing pad 26 of the ROIC 14 circuitry using a conductor 24, such as a flowable or curable conductor 24. A second end of each trace 22 can be physically attached and electrically coupled to a trace 32 within the package body 30 using conductor 36 similar or different from conductor 24. Attachment of the lid 20 to the package body 30 can also include the use of a hermetic sealing material 38 such as a metal, epoxy, polymer, eutectic, etc. After attachment of the lid 20 to the package body 30, a structure similar to that depicted in FIG. 1 remains. The FPA 10 of FIG. 1 thus includes a PDA 12 and a ROIC 14 sealed within an FPA package 10. A lower surface of the lid 20 to which the PDA 12 is attached has the plurality of traces 22 attached thereto, with the traces 22 being sealed within the FPA package 10. It should be readily apparent to those of ordinary skill in the art that the FPA 10 depicted in FIG. 1 represents a generalized schematic illustration and that other components may added or existing components may be removed or modified.

Thus an electrical path can be established between circuitry on the PDA 12 and circuitry the ROIC 14 using the bumps 16. These bumps 16 may provide a more robust electrical connection, for example, than the bond wires 218 depicted in FIG. 3. Additionally, a conductive path between circuitry on the ROIC 14 and the pads 34 external to the FPA package 10 (and thus also between circuitry on the PDA 12 and the pads 34) can be established through landing pads 26 on the ROIC 14 that are electrically coupled to a first plurality of traces 22 on the lid 20 through conductor 24. The traces 22 on the lid 20 can be electrically coupled to a second plurality of traces 32 within the package body 30 through conductor 36. Traces 32 are electrically coupled to pads 34 through known techniques.

Thus the embodiment of FIG. 1 provides an FPA 10 that routes signals from the PDA 12 circuitry and the ROIC 14 circuitry on the interior of the package 10 to pads 34 on an outer or exterior surface of the package 10 using no bond wires 212 such as those depicted in FIG. 3. Further, electrical coupling between the ROIC 14 and the PDA 12 is established using conductive bumps 16 rather than bond wires 218 (FIG. 3).

Additionally, an FPA 10 having a smaller height can be formed, for example because the bottom surface of the lid 20 can be closer to, and even directly attached to, an upper surface of the PDA 12 as depicted in FIG. 1. Further, the plurality of electrical connections within the FPA 10 may be smaller and more reliable than bond wires 212. As depicted in FIG. 1, in an embodiment, all electrical connections between the PDA 12 and the ROIC 14 are provided within an outside perimeter of the PDA 12.

FIG. 2 is a schematic view of a plurality of devices 10 formed using a wafer scale integration process. While FIG. 2 depicts two attached devices 10 prior to singularization, it will be appreciated that any number of devices 10 can be formed using a wafer scale process. The number of devices 10 that can be formed is limited, for example, by the size of the semiconductor wafer 50 and the size of the FPA devices 10. After forming the FIG. 3 structure, for example according to the techniques discussed above adapted for a wafer scale process, the plurality of PDAs 10 can be separated or singularized into a plurality of discrete PDA devices by dicing the structure along line 52 using, for example a dicing saw, laser ablation, etc.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. A focal plane array (FPA), comprising:
 a package body extending continuously between an upper surface and a lower surface to define outer sides, the package body having a cavity formed therein to define inner sidewalls and an inner surface extending between the inner sidewalls;

a dielectric attachment material having a first surface disposed directly against the inner surface of the package body and a second surface disposed directly against a read out integrated circuit (ROIC) comprising a circuit side having circuitry thereon;

a photodiode array (PDA) comprising circuitry including a plurality of photodiodes; and a conductor interposed between the PDA and the ROIC, wherein the conductor electrically couples circuitry on the PDA to circuitry on the ROIC;

an optically transparent lid including an inner surface extending continuously between a pair of opposing outer edges, the outer edges attached to the outer sides of package body via a hermetic sealing material interposed between the optically transparent lid and the outer sides, wherein the package body and the lid define an interior of the FPA, and wherein the PDA and the ROIC are sealed within the interior of the FPA such that the inner surface of the optically transparent lid extends beyond the PDA and the ROIC; and a plurality of conductive traces on an interior surface of the lid, wherein the circuitry on the ROIC is electrically coupled to the plurality of conductive traces on the interior surface of the lid, the plurality of conductive traces including a first trace and an opposing second trace, wherein the dielectric layer is interposed between the first and second traces so as to physically attach the optically transparent lid to the PDA.

2. The focal plane array of claim 1, further comprising a plurality of trenches on the interior surface of the lid, wherein the plurality of traces are within the plurality of trenches.

3. The focal plane array of claim 1, wherein the package body is a chip carrier.

4. The focal plane array of claim 1, wherein the package body is a printed circuit board.

5. The focal plane array of claim 1, wherein:
the PDA comprises no bond wires that electrically couple the PDA to the ROIC; and
the PDA comprises no bond wires that electrically couple the ROIC to the package body.

6. The focal plane array of claim 2, further comprising a plurality of traces within the package body, wherein the plurality of traces on the interior surface of the lid are electrically coupled with the plurality of traces within the package body.

7. The focal plane array of claim 6, further comprising a dielectric that physically attaches the PDA to the interior surface of the lid.

8. The focal plane array of claim 7, wherein the plurality of bumps are within an outside perimeter of the PDA.

9. The focal plane array of claim 8, wherein:
the PDA comprises no bond wires that electrically couple the PDA to the ROIC; and
the PDA comprises no bond wires that electrically couple the ROIC to the package body.

10. A method for forming a focal plane array (FPA), comprising:
physically contacting a first plurality of landing pads on a photodiode array (PDA) to a conductor;
physically contacting a second plurality of landing pads on a read out integrated circuit (ROIC) to the conductor, wherein the conductor is interposed between the PDA and the ROIC;
curing the conductor to physically attach the PDA and the ROIC to each other and to electrically couple circuitry on the PDA with circuitry on the ROIC; and attaching the PDA to an optically transparent lid such that outer edges of the optically transparent lid extend beyond sides of the PDA;

attaching the optically transparent lid to an upper surface of a package body that extends between opposing sidewalls, the outer edges of the optically transparent lid sealed to the upper surface via a hermetic sealing material interposed between the outer edges of the optically transparent lid and the sidewalls;

electrically coupling a first end of a first plurality of conductive traces on the lid to the circuitry on the ROIC, the first plurality of conductive traces including a first upper trace interposed between a first sidewall of the opposing sidewalls and a first side of the PDA, and a second upper trace interposed between a second sidewall of the opposing sidewalls and a second side of the PDA opposite the first side;

electrically coupling a second end of the first plurality of conductive traces on the lid to a second plurality of conductive traces within the package body, the second plurality of conductive traces including a first lower trace interposed between the first sidewall of the opposing sidewalls and a first side edge of the ROIC, and a second lower trace interposed between a second sidewall of the opposing sidewalls and a second side edge of the ROIC opposite the first side; and prior to attaching the optically transparent lid, depositing a dielectric attachment material having a first surface disposed directly against the inner surface of the package body and a second surface disposed directly against a read out ROIC comprising a circuit side having circuitry thereon, wherein the dielectric layer is interposed between the first and second traces so as to physically attach the optically transparent lid to the PDA.

11. The method of claim 10, further comprising electrically coupling the circuitry on the ROIC to a plurality of castellations on an exterior surface of the package body during the electrical coupling of the first end of the first plurality of conductive traces on the lid to the circuitry on the ROIC and the electrical coupling of the second end of the first plurality of conductive traces on the lid to the second plurality of conductive traces within the package body.

12. The method of claim 10, further comprising:
providing a chip carrier package body; and
attaching the optically transparent lid to the chip carrier package body.

13. The method of claim 10, further comprising:
providing a printed circuit board package body; and
attaching the optically transparent lid to the printed circuit board package body.

14. The method of claim 10, further comprising:
forming the FPA attached to a plurality of other FPAs as part of a wafer scale integration process; and
singularizing the plurality of FPAs to form a plurality of discrete FPAs.

15. The method of claim 11, further comprising:
forming a plurality of trenches on the interior surface of the lid;
forming a blanket metal layer over the interior surface of the lid and within the plurality of trenches on the interior surface of the lid; and
planarizing the blanket metal layer to form the plurality of conductive traces.

* * * * *